(12) United States Patent
Boeve et al.

(10) Patent No.: US 9,496,490 B2
(45) Date of Patent: Nov. 15, 2016

(54) NON-VOLATILE MEMORY

(75) Inventors: Hans Boeve, Hechtel-Eksel (BE); Karen Attenborough, Hechtel-Eksel (BE)

(73) Assignee: NXP B.V., Eindhoven (NL)

( * ) Notice: Subject to any disclaimer, the term of this patent is extended or adjusted under 35 U.S.C. 154(b) by 2024 days.

(21) Appl. No.: 11/720,826

(22) PCT Filed: Dec. 2, 2005

(86) PCT No.: PCT/IB2005/054032
§ 371 (c)(1),
(2), (4) Date: Sep. 18, 2009

(87) PCT Pub. No.: WO2006/059313
PCT Pub. Date: Jun. 8, 2006

(65) Prior Publication Data
US 2010/0127232 A1    May 27, 2010

Related U.S. Application Data

(60) Provisional application No. 60/593,043, filed on Dec. 2, 2004.

(51) Int. Cl.
*H01L 45/00* (2006.01)
*H01L 27/24* (2006.01)

(52) U.S. Cl.
CPC ........... *H01L 45/06* (2013.01); *H01L 27/2472* (2013.01); *H01L 45/12* (2013.01); *H01L 45/1233* (2013.01); *H01L 45/1246* (2013.01); *H01L 45/144* (2013.01); *H01L 45/16* (2013.01)

(58) Field of Classification Search
CPC ................. H01L 45/06; H01L 45/1233; H01L 45/1246; H01L 45/126; H01L 45/1273; H01L 45/141; H01L 45/144; H01L 45/1633
USPC .......................................................... 257/2–5
See application file for complete search history.

(56) References Cited

U.S. PATENT DOCUMENTS

| | | | |
|---|---|---|---|
| 5,166,758 A | 11/1992 | Ovshinsky et al. | |
| 5,536,947 A | 7/1996 | Klersy et al. | |
| 5,687,112 A * | 11/1997 | Ovshinsky | 365/163 |
| 6,172,902 B1 | 1/2001 | Wegrowe et al. | |
| 6,339,544 B1 | 1/2002 | Chiang et al. | |
| 6,576,318 B2 | 6/2003 | Lee | |
| 6,707,087 B2 | 3/2004 | Fricke et al. | |
| 6,710,987 B2 | 3/2004 | Sun | |
| 6,870,751 B2 | 3/2005 | Van Brocklin | |
| 7,023,014 B2 * | 4/2006 | Morimoto et al. | 257/42 |

(Continued)

FOREIGN PATENT DOCUMENTS

| | | |
|---|---|---|
| EP | 0894323 B1 | 4/1997 |
| EP | 1331675 | 1/2002 |

(Continued)

*Primary Examiner* — Yu Chen

(57) ABSTRACT

A non-volatile memory (50) is disclosed. A second electrode (56) is provided. A first electrode (51) is also provided. A recording layer having a plurality of phase change cells (54) variable in resistance is provided between the first electrode (51) and the second electrode (56). A non-uniform tunnel barrier (540) is provided adjacent each of the recording layer and the first electrode. In use, the first electrode is in electrical communication with the non-uniform tunnel barrier, the first electrode for electrically communicating with the second electrode via the non-uniform tunnel barrier.

13 Claims, 5 Drawing Sheets

(56) References Cited

U.S. PATENT DOCUMENTS

| | | |
|---|---|---|
| 2002/0097534 A1 | 7/2002 | Sun et al. |
| 2003/0234449 A1* | 12/2003 | Aratani et al. ............... 257/758 |
| 2004/0001374 A1 | 1/2004 | Tanaka et al. |
| 2004/0080823 A1 | 4/2004 | Takushima et al. |
| 2004/0095801 A1 | 5/2004 | Stipe |
| 2004/0188688 A1 | 9/2004 | Muranaka |
| 2004/0197947 A1* | 10/2004 | Fricke ............... G11C 13/0004 438/102 |
| 2005/0093092 A1* | 5/2005 | Tran et al. .................... 257/530 |

FOREIGN PATENT DOCUMENTS

| | | |
|---|---|---|
| EP | 1265235 A2 | 11/2002 |
| WO | 97/05665 | 2/1997 |
| WO | 97/40499 | 10/1997 |
| WO | 98/19350 | 5/1998 |
| WO | 98/33644 | 8/1998 |
| WO | 99/54128 | 10/1999 |
| WO | 2006072842 A1 | 7/2006 |

* cited by examiner

NON-VOLATILE MEMORY

The present invention relates to non-volatile memories, and more particularly to non-volatile memories wherein data is recorded or erasable by heating and cooling of phase change cells therein.

Already blown as non-volatile memories are flash memories, FeRAMs, MRAMs, and phase-change memories. U.S. Pat. No. 6,172,902, for example, discloses an MRAM incorporated in a membrane, and U.S. Pat. No. 5,166,758 discloses the construction of a phase-change memory.

Since higher densities are required of memories for use in portable information terminals and the like, attention has been directed to phase-change non-volatile memories, and various improvements have been made in such memories [WO97/05665 (Japanese Unexamined Patent Publication No. 1999-510317), WO98/19350 (Japanese Unexamined Patent Publication No. 2001-502848), WO99/54128 (Japanese Unexamined Patent Publication No. 2002-512439), U.S. Pat. No. 6,339,544, and U.S. Pat. No. 5,536,947].

One limitation on the widespread adoption of phase change memories is their physical size. The size of a phase change cell is limited by the resistive heater associated therewith. Though much research has been focused on improving phase change cell based memory, the phase change cell size remains large.

One approach to reducing the phase change cell size is to constrict current flow within the resistive heater to increase localized heating. Such an approach has been suggested in WO98/336446 (Japanese Unexamined Patent Publication No. 2001-504279) and in U.S. Patent Application 2004/0001374 wherein the resistive heater proximate the phase change layer is very narrow.

Unfortunately, each of the above methods has limitations, for example, in reliability and manufacture. It would be advantageous to provide a straightforward structure for providing current constriction that is manufacturable with current integrated circuit manufacturing equipment.

It is an object of the present invention to provide a non-volatile memory supporting a reduced dimension for phase change cells therein.

In accordance with the invention there is provided a non-volatile memory comprising: a second electrode; recording layer comprising a plurality of phase change cells variable in resistance; a non-uniform tunnel bather adjacent the recording layer; and, a first electrode in electrical communication with the non-uniform tunnel barrier, the first electrode for electrically communicating with the second electrode via the tunnel barrier.

In accordance with another aspect of the invention there is provided a method of forming a phase change cell memory comprising: providing a cell comprising a phase change material; providing a non-uniform tunnel barrier adjacent the phase change material; and providing a first electrode for providing current to the non-uniform tunnel barrier and second electrode for receiving of the current having passed through the tunnel barrier.

According to the invention there is further provided a non-volatile memory comprising: a plurality of second electrodes arranged in a regularly spaced array; a recording layer comprising a plurality of phase change cells each variable in resistance and arranged in a regularly spaced array; a non-uniform tunnel barrier forming an approximately contiguous layer adjacent a plurality of phase change cells within the recording layer; and, a plurality of first electrodes arranged in a regularly spaced array and each associated with an electrode of the plurality of second electrodes and with a phase change cell of the plurality of phase change cells, the first electrodes in electrical communication with the non-uniform tunnel barrier, the first electrodes for electrically communicating each with its corresponding second electrode via the tunnel barrier.

Exemplary embodiments of the invention will now be described in conjunction with the following drawings, in which.

Figure 1:
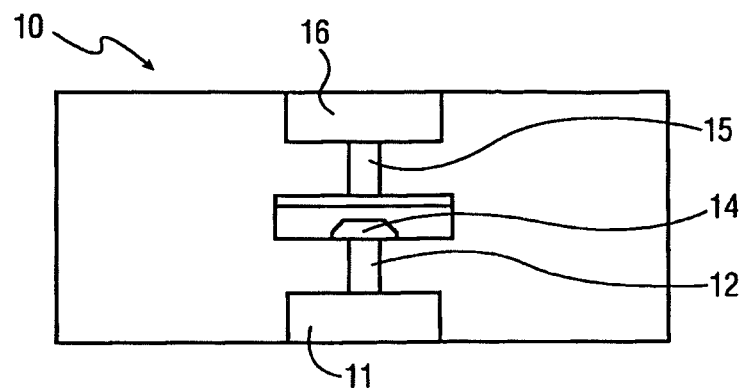
FIG. 1 is a cross sectional side view showing a prior art non-volatile memory.

Referring to FIG. 1, a typical prior art phase change cell 10 is shown. Here, a first electrode 11 is shown. A first conductor 12 in the form of a via is disposed in electrical contact with the electrode 11. Adjacent the first conductor 12 is a cell comprising a programmable volume of phase change material 14. A second conductor 15 in the form of a via is disposed on an opposing side of the cell 14. In electrical contact with the conductor 15 is a second electrode 16.

During operation, a current is applied to the first electrode 11. The current is confined within the first conductor 12 resulting in heating of the phase change material within the programmable volume 14. With slow cooling, the phase change material enters a crystalline state. With more rapid cooling, the phase change material enters an amorphous state. In its amorphous state, the phase change material has a different resistance from in its crystalline state, and as such, the state of a cell is determinable based on the resistance of the programmable volume of phase change material therein.

Figure 2:
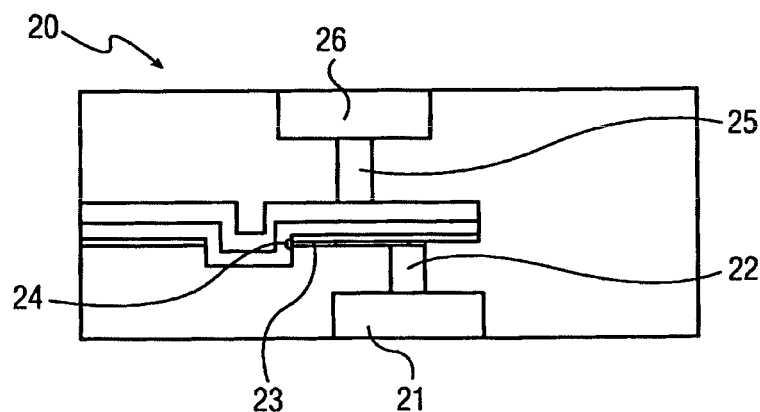
FIG. 2 is a cross sectional side view showing a prior art non-volatile memory having a smaller cell having phase change material therein.

Referring to FIG. 2, another phase change cell 20 according to the prior art is shown. Here, a first electrode 21 is shown. A first conductor 22 in the form of a via is disposed in electrical contact with the electrode 21. Adjacent the first conductor 22 is another conductor 23 laterally extending from the first conductor toward a cell comprising a programmable volume of phase change material 24. A second conductor 25 in the form of a via is disposed on an opposing side of the cell 24. In electrical contact with the conductor 25 is a second electrode 26. Operation of the phase change cell 20, is similar to operation of the phase change cell 10.

Figure 3:
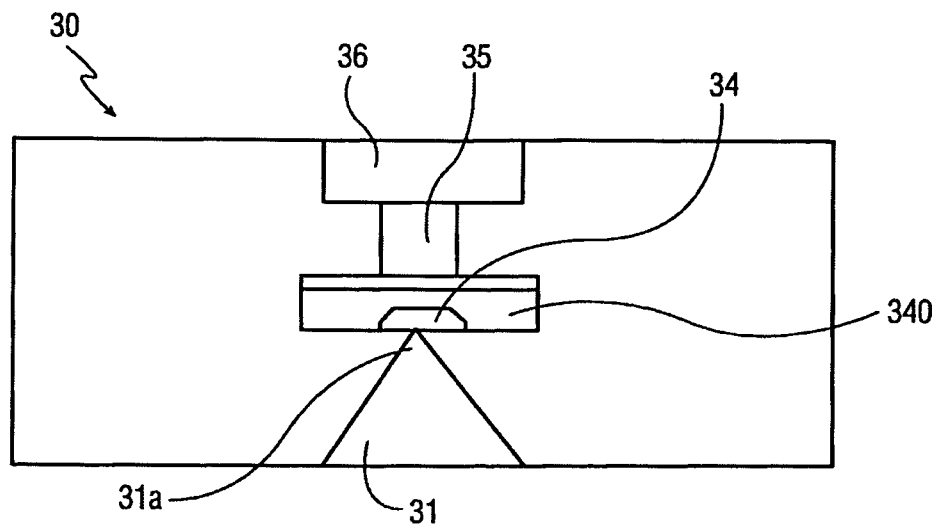
FIG. 3 is a cross sectional side view showing a prior art non-volatile memory having a tapered electrode for providing localized heating due to current flow constriction.

WO98/336446 (Japanese Unexamined Patent Publication No. 2001-504279) discloses, as shown in FIG. 3, a phase-change non-volatile memory 30 is shown having a lower electrode 31, an upper electrode 36, and a programmable volume of phase-change material 34 which is formed therebetween and through which current can be passed via the electrode 31 the conductor 35 and the electrode 36. The phase-change material 34 comprises a chalcogenide material, which is reversibly changeable in phase between an amorphous (noncrystalline) state of high resistance and a crystalline state of low resistance. The material is changed to the noncrystalline state or crystalline state by the passage of current to control the resistance value. For example when data is stored (written), the programmable volume of phase-change material 34 is changed from the amorphous state to the crystalline state and thereby given a low resistance value, while when data is to be erased, the phase-change material 34 is changed from the crystalline state to the amorphous state and given a high resistance value. Thus the difference in resistance value is read to use the layer as a memory. Alternatively, data is written by changing the phase change material to the amorphous state and erased by changing the phase change material to the crystalline state.

In the construction shown in FIG. 3, a joint portion 31a between the lower electrode 31 and the programmable volume of phase-change material 34 is shaped in a frusto-conical form to thereby provide an improved current density near the tip thereof. The joint portion 31a is formed by undercutting a pattern (not shown) formed on the phase-change layer 340 by photolithography. After the pattern is removed, the layer 340 is formed on the joint portion 31a by photolithography.

WO97/40499 (Japanese Unexamined Patent Publication No. 2000-509204) also discloses a structure which is similar to the above and in which a joint portion between a lower electrode and a phase-change material layer is tapered toward the phase-change material layer with a decreasing cross sectional area to give a higher current density at the tapered end.

Giving an increased current density in this way is effective from the viewpoint-of achieving savings in the electric power and speed of the memory for writing and erasing data. However, if the contact between the electrode and the phase-change material layer is diminished, there arises the problem that faulty conduction is liable to occur between the electrode and the layer to result in a lower yield. The need to form the phase-change material layer accurately at the position where the joint portion 31a is formed, further entails the problem of reducing the freedom of design.

Figure 4:
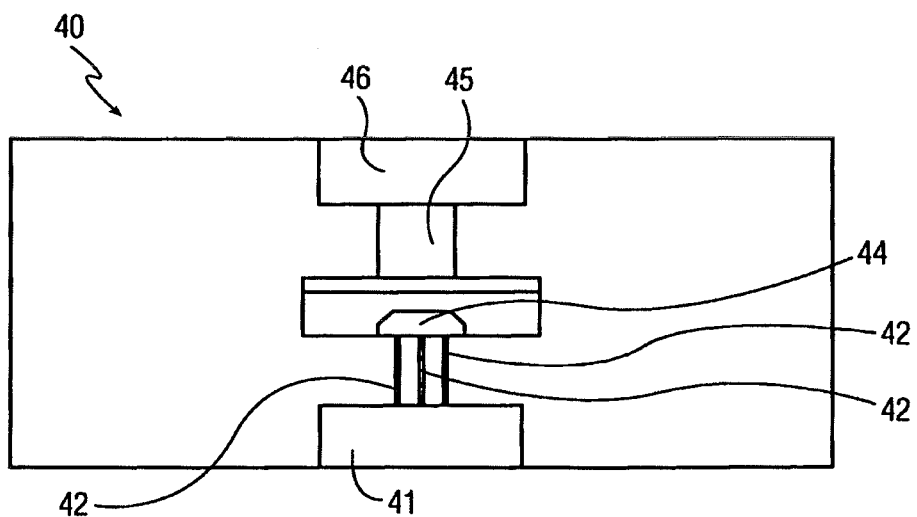
FIG. 4 is a cross sectional side view showing a prior art non-volatile memory having nanowires for providing localized heating due to current flow constriction.

Referring to FIG. 4, an alternative prior art embodiment of a phase change cell 40 as disclosed in US patent application 2004/0001374 is shown. A first electrode 41 is shown having a plurality of nanowires 42 in contact therewith. The nanowires provide for current constriction similar to the tapering in the embodiment of FIG. 3 without restricting the design in a same fashion. A cell with phase change material therein 44 is disposed adjacent the nanowires 42. A second electrode is disposed on an opposing side of the cell with phase change material therein.

Figure 5A:
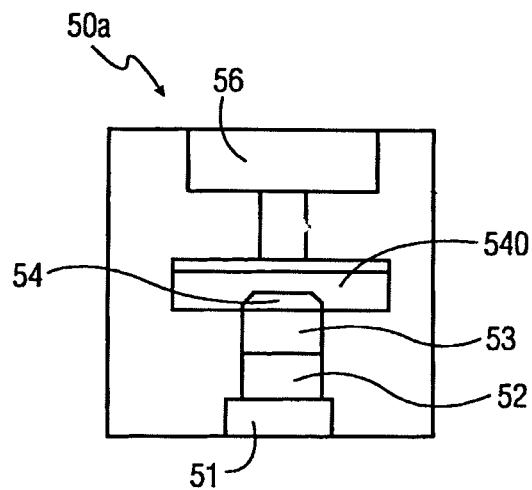
FIG. 5a is a cross sectional side view of non-volatile memory based on a phase change cell and having a non-uniform tunnel barrier for providing localized heating due to current flow constriction.

Referring to FIG. 5a, cross sectional view of a structures 50a according to the invention is shown. A first electrode 51 and a second electrode 56 are shown. Disposed therebetween is a phase change layer 540 having a programmable volume of phase change material 54 therein. The phase change cell has a non-uniform tunnel barrier 53 disposed adjacent thereto and between the phase change layer 540 and a first conductor 52. The non-uniform barrier 53 is either located within the via hole (as shown in FIG. 5a), or directly on top of the via hole hence patterned with the phase change layer 540. The non-uniform tunnel barrier 53 acts to constrict current flowing therethrough in accordance with well-known tunnel barrier theory. The resulting structure provides localized heating due to current concentration at or about points of constriction within the tunnel barrier. This localized heating allows for smaller cells comprising phase change material and faster data storage. As such, current constriction is highly advantageous. Further, the nature of the tunnel barrier is indicative of a statistical distribution of constricted current flows such that placement and spacing of cells comprising phase change material is based on the tunnel barrier design and manufacture. Thus, the invention supports higher densities for integrated phase change memory devices than devices absent current constricting architectures.

Figure 5B:
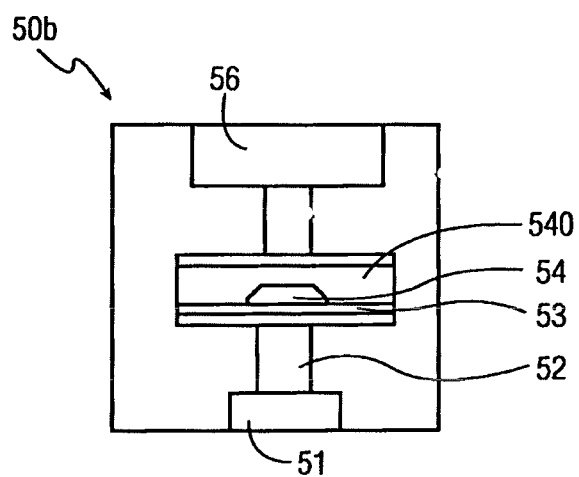
FIG. 5b is a cross sectional side view of non-volatile memory based on a phase change cell and having a non-uniform tunnel barrier for providing localized heating due to current flow constriction.

Referring to FIG. 5b—a cross sectional view of a structure 50b according to the invention is shown. A first electrode 51 and a second electrode 56 are shown. Disposed therebetween is a phase change layer 540 having a programmable volume of phase change material 54 therein. The phase change cell has a non-uniform tunnel barrier 53 disposed adjacent thereto and between the phase change layer 540 with programmable volume 54 and the first conductor 52. The non-uniform tunnel barrier 53 acts to constrict current flowing therethrough in accordance with well-known tunnel barrier theory, as indicated by the black lines.

In this embodiment, the layered stack in the phase change cell comprises a metal layer, a non-uniform tunnel barrier 53, a phase change layer 540 with programmable volume 54, and another metal layer. The metal layers can be added as adhesion layer, or diffusion barrier. Omitting the first metal layer corresponds to the embodiment of FIG. 5a where the non-uniform tunnel barrier 53 is patterned along with the phase change layer 540.

In an alternative embodiment, the non-uniform tunnel barrier 53 is inserted between the phase change layer 540 and the top metal layer. In yet another embodiment, the non-uniform tunnel barrier 53 is inserted within the phase change layer 540, in such a way that the non-uniform tunnel barrier 53 is in fact adjacent two phase change layers, that may comprise identical or different phase change material. In this last case, the phase change cell optionally comprises a layered structure (metal-phase change-tunnel barrier-phase change-metal).

Tunnel barriers are generally known and have been used in several arts. For example in MRAM, it is known to use a thin Al oxide tunnel barrier fabricated by post-oxidation of a precursor Al layer, yielding a tunnel magnetoresistance (TMR) effect that is considered one of the best to date. A typical tunnel barrier thickness is in the order of 1-2 nm.

Alternative tunnel barrier materials include Mg oxide, Hf oxide, Ta oxide, Si oxide, Si nitride, etc., as well as a mixture of different compounds. In general, tunnel barriers are optionally formed using a variety of techniques, such as previously described by deposition of a precursor layer, e.g. by sputtering or evaporation, which is followed by an oxidation or nitridation step. Alternatively, the initial surface, which is preferably either the surface of a metal layer or of a phase-change recording layer, is first oxidized after which the precursor layer (e.g. Al) is deposited. A tunnel barrier is then formable by solid-state reaction of the oxidized initial surface and the precursor layer. In most cases thermal treatment is required. Finally, the tunnel barrier is deposited directly on the initial surface, which is either the surface of a metal layer or of a phase-change recording layer. Deposition techniques for direct deposition of oxides and nitrides include reactive sputtering, chemical vapor deposition (CVD), atomic layer deposition (ALD), etc. Optionally, other deposition techniques suitable for the application are used.

Accordingly, through a use of non-uniform tunnel barriers, not-optimal tunnel barriers, a highly inhomogeneous current flow through the tunnel barrier is obtainable to result in "hot spots" where a constricted current flows, given the exponential dependence of current density with tunnel barrier thickness. Experiments with a conductive atomic force microscope (AFM) resulted in plenty of experimental evidence for this effect. This effect allows for creation of localized heating for use in phase change memory cell design.

Though three methods for realizing a highly inhomogeneous current flow in the tunnel barrier are disclosed hereinbelow, other non-uniform tunnel barriers—tunnel barriers supporting non-uniform current flow and creating localized heating—are possible for use with phase change materials and are within the scope of the present invention.

Figure 6:
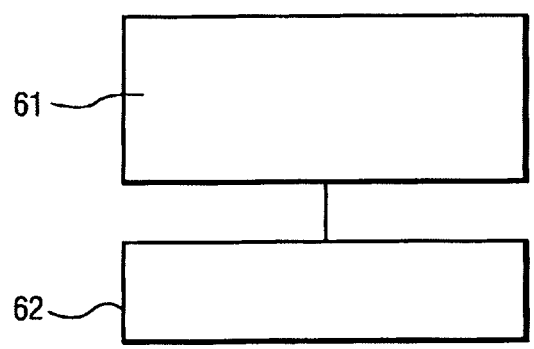
FIG. 6 is a simplified flow diagram of a method of forming the non-uniform tunnel barrier.
Figure 7A:
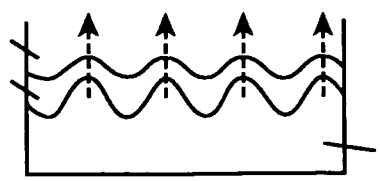
FIG. 7a is a simplified side view of a resulting tunnel barrier manufactured according to the method of FIG. 6.

Referring to FIG. 6, a simplified flow diagram is shown for a method of manufacturing a non-uniform tunnel barrier according to the invention. Advantageously, the method does not require different materials or equipment compared to tunnel barrier fabrication for MRAM devices. As such, it is compatible with some current fabrication equipment. An initial surface for forming the tunnel barrier thereon is provided at 61, which is either phase-change material or another metal, is rough in comparison to the thickness of the tunnel barrier. A tunnel barrier is grown at 62 on the initial surface resulting in a tunnel barrier with varying thickness as shown in FIG. 7a. Since the flow of current across a tunnel barrier is related to a thickness thereof in an exponential fashion, narrower tunnel barriers passing more current than thicker tunnel barriers, a non-homogeneous current flow across the tunnel barrier occurs when the device is used.

Figure 7B:
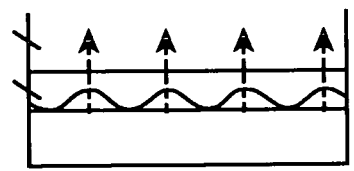
FIG. 7b is a simplified side view of a resulting tunnel barrier manufactured in accordance with a variation to the method of FIG. 6.
Figure 7C:
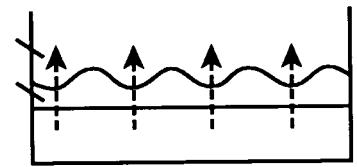
FIG. 7c is a simplified side view of a resulting tunnel barrier manufactured in accordance with yet another variation to the method of FIG. 6.

Alternatively, when the initial surface is a smooth surface, the tunnel barrier with varying thickness is formed, for example, by forming a precursor layer with varying thickness as shown in FIG. 7b. The precursor layer is optionally deposited with varying thickness. Alternatively, the precursor layer is a result of an oxidation process that results in an oxide layer with varying thickness. The latter is obtainable by making use of a natural oxidation process that is known to proceed faster along grain boundaries. By modifying a grain size and oxidation budget, the tunnel barrier characteristics are modifiable. Selection of an appropriate grain size and oxidation budget is important and is easily determinable through experimentation. A few examples are given below. Alternatively, the tunnel barrier is formed directly on a flat surface and is formed having varied thickness as shown in FIG. 7c.

Figure 8:
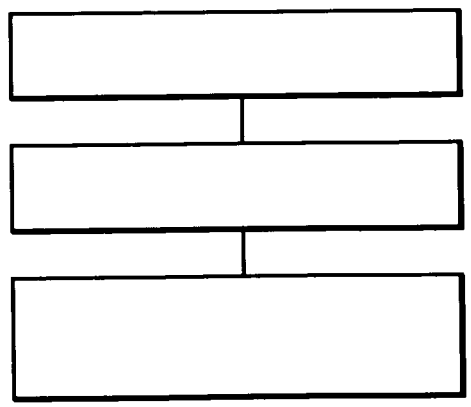
FIG. 8 is a simplified flow diagram of a method of forming a non-uniform tunnel barrier based on self-organisation; and, FIG. 9 is a side cross sectional view of a tunnel barrier formed according to the method of FIG. 8.

Relying on "self-organisation," it has been discovered that non-uniform tunnel barriers are formable. Referring to FIG. 8, a simplified flow diagram of a method of forming such a non-uniform tunnel barrier is presented. A compound precursor material in the form of e.g. Al—Cu alloys having a Cu content ranging up to several tens of at % is deposited. Due to a different oxidation rate of each metal an Al oxide matrix is formed as are Cu particles.

As a result of the oxidation, Cu atoms may segregate. The resulting tunnel barrier has portions of oxidized Al and other portions of Cu. Thus, non-homogeneous material within the tunnel barrier acts to result in a non-uniform tunnel barrier supporting current constriction thereacross.

A preferred material system comprises at least one oxide network former along with at least one noble metal that is less prone to oxidation. Noble materials may include Ag, Au, Cu, Pt, Ru, etc. As a result, a tunnel barrier with approximately parallel conductive paths is formed.

Alternatively, another material system is used in accordance with the method of FIG. 8. A multilayer of e.g. Al—Cu—Al material is provided as a precursor material where a middle layer thereof is known to wet difficultly on the Al layer. As a result, 3D island formation is realized during growth. After oxidation, this results in regions with higher current density supporting current flow constriction. Alternatively, different material systems are used having similar properties.

Figure 9:
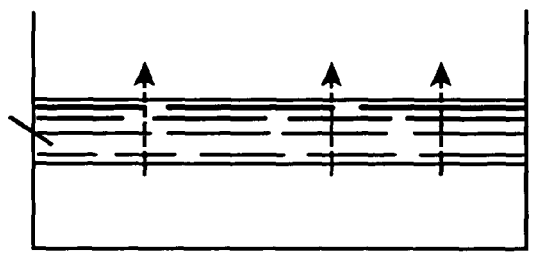

A cross sectional view of a non-uniform tunnel barrier formed according to the method of FIG. 8 is shown in FIG. 9.

Preferably, the non-uniform tunnel barrier is a non-homogeneous tunnel barrier with large local current density differences during use. Here current constriction for supporting localized heating results from a non-uniform tunnel barrier adjacent the phase change layer. Since the non-uniform nature of the tunnel barrier is based on principles that act at an atomic level, the resulting "hot-spots" will be spread homogeneously over a Si wafer, throughout the tunnel barrier surface. The density of "hot-spots" is optionally tailored such that it supports the fabrication of many phase change cells using a single tunnel barrier. This facilitates implementation and manufacture of dense arrays of phase change memory cells. The programmable material is optionally any phase change memory material known in the art. Preferably, the phase change materials are capable of exhibiting a first order phase transition. For examples of suitable materials reference is made to U.S. Pat. No. 6,613, 604, hereby incorporated by reference, and to the other documents cited therein, hereby incorporated by reference. This patent explains that the phase change materials are formable from a plurality of atomic elements. Preferably, the programmable material includes at least one chalcogen element. The chalcogen element is optionally chosen from the group consisting of Te, Se, and mixtures or alloys thereof. The programmable material typically includes at least one element selected from the group consisting of Ge, Sb, Bi, Pb, Sn, As, S, Si, P, O, and mixtures or alloys thereof. In one embodiment, the programmable material comprises the elements Te, Ge and Sb. In another embodiment, the programmable material consists essentially of Te, Ge and Sb. An example of a programmable material that may be used is Tet Ge2 Sb5.

The memory material optionally includes at least one transition metal element. The term "transition metal" as used herein includes elements 21 to 30, 39 to 48, 57 and 72 to 80 on the periodic table. Preferably, the one or more transition metal elements are selected from the group consisting of Cr, Fe, Ni, Nb, Pd, Pt and mixtures or alloys thereof. The memory materials that include transition metals are optionally elementally modified forms of the memory materials in the Te—Ge—Sb ternary system. This elemental modification is achievable by the incorporation of transition metals into the basic Te—Ge—Sb ternary system, with or without an additional chalcogen element, such as Se.

Numerous other embodiments may be envisaged without departing from the spirit or scope of the invention.

What is claimed is:

1. A non-volatile memory comprising:
    a recording layer including a plurality of phase change cells variable in resistance;
    a tunnel barrier deposited on a surface of the recording layer and having a oxidized material that forms a plurality of non-constricted regions and a noble metal that forms a plurality of constricted regions, the constricted regions being in contact with the recording layer and distributed across the tunnel barrier and configured and arranged to constrict current flow as a result of current density differences in the tunnel barrier, wherein the current density differences are sufficient to locally heat the plurality of phase change cells at the plurality of constricted regions relative to heat at the plurality of non-constricted regions; and
    a first electrode in electrical communication with the tunnel barrier, the first electrode for electrically communicating with a second electrode via the tunnel barrier, wherein the non-volatile memory further includes the second electrode.

2. A non-volatile memory according to claim 1 wherein the plurality of non-constricted regions and the plurality of constricted regions form an oxide network including approximately parallel conductive paths that correspond to the noble metals.

3. A non-volatile memory according to claim 1 wherein the tunnel barrier has a thickness that is greater than 1 nanometer and less than 2 nanometers.

4. A non-volatile memory according to claim 1 wherein the tunnel barrier comprises a layer of uniform thickness having a non-uniform composition.

5. A non-volatile memory according to claim 1 wherein the tunnel barrier is configured to non-homogeneously flow current.

6. The non-volatile memory according to claim 1 wherein the recording layer comprises a phase-change material having at least two stable phases different in resistance value and capable of being reversibly switched between the phases.

7. The non-volatile memory according to claim 1 wherein the recording layer includes a phase-change material including a chalcogenide material.

8. The non-volatile memory according to claim 1, wherein the tunnel barrier includes narrower portions and thicker portions at an atomic level, the narrower and thicker portions randomly arranged one relative to the other to generate large local current density differences to locally heat corresponding areas of the phase change cells.

9. The non-volatile memory of claim 1, wherein the tunnel barrier is configured and arranged to constrict current flow by constricting current flow through a region in the barrier having a smaller cross-sectional area via which the current must flow, relative to a cross-sectional area in another region of the tunnel barrier.

10. The non-volatile memory of claim 1, wherein the plurality of non-constricted regions and the plurality of constricted regions of the tunnel barrier are defined by regions of Al oxide and Cu, respectively.

11. The non-volatile memory of claim 1, wherein the constricted regions are configured with a homogenous distribution, thereby creating hot-spots homogeneously spread across an interface between the tunnel barrier and the recording layer in response to current passing through the constricted regions.

12. The non-volatile memory of claim 11, wherein the hot-spots are arranged across the tunnel barrier with a density tailored to locally heat each of the plurality of phase change cells.

13. A non-volatile memory according to claim 1, wherein the tunnel barrier includes regions having Al oxide and Cu.

* * * * *